(12) United States Patent
Kondo

(10) Patent No.: US 8,153,901 B2
(45) Date of Patent: Apr. 10, 2012

(54) METHOD FOR FABRICATING MULTILAYER CIRCUIT BOARD, CIRCUIT PLATE, AND METHOD FOR FABRICATING THE CIRCUIT PLATE

(75) Inventor: Masayoshi Kondo, Akita (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 957 days.

(21) Appl. No.: 12/092,160

(22) PCT Filed: Oct. 30, 2006

(86) PCT No.: PCT/JP2006/321623
§ 371 (c)(1),
(2), (4) Date: Apr. 30, 2008

(87) PCT Pub. No.: WO2007/052584
PCT Pub. Date: May 10, 2007

(65) Prior Publication Data
US 2009/0126975 A1 May 21, 2009

(30) Foreign Application Priority Data

Nov. 4, 2005 (JP) .................. 2005-321336
Nov. 4, 2005 (JP) .................. 2005-321406

(51) Int. Cl.
*H05K 1/00* (2006.01)
(52) U.S. Cl. ...................................... 174/250
(58) Field of Classification Search .................. 174/259, 174/250, 258, 264
See application file for complete search history.

(56) References Cited

U.S. PATENT DOCUMENTS

| | | | |
|---|---|---|---|
| 6,623,844 B2 * | 9/2003 | Nishimoto | 428/209 |
| 6,791,036 B1 | 9/2004 | Chen et al. | |
| 2001/0005545 A1 * | 6/2001 | Andou et al. | 428/209 |

FOREIGN PATENT DOCUMENTS

| | | |
|---|---|---|
| DE | 4404298 | 8/1995 |
| EP | 0446656 | 9/1991 |
| JP | 8-195560 | 7/1996 |
| JP | 8-316598 | 11/1996 |
| JP | 11-54934 | 2/1999 |
| JP | 2000-59028 | 2/2000 |
| JP | 2004-311909 | 11/2004 |

OTHER PUBLICATIONS

European Search Report issued by the European Patent Office on Aug. 20, 2009.

* cited by examiner

*Primary Examiner* — Jeremy Norris
*Assistant Examiner* — Tremesha S Willis
(74) *Attorney, Agent, or Firm* — Ditthavong Mori & Steiner, P.C.

(57) ABSTRACT

A multilayer circuit board is fabricated by: preparing a film comprising a first protective film and a first interlayer adhesive; preparing a first circuit board having a first base and a conductive post protruding therefrom; stacking the first interlayer adhesive and the conductive post together; peeling off the first protective film; preparing a second circuit board including a conductive pad receiving the conductive post; and bonding the first circuit board and the second circuit board through the first interlayer adhesive so that the conductive post and the conductive pad face each other, wherein the first interlayer adhesive 104 at the top portion of the conductive post is selectively removed while peeling off the first protective film.

28 Claims, 10 Drawing Sheets

METHOD FOR FABRICATING MULTILAYER CIRCUIT BOARD, CIRCUIT PLATE, AND METHOD FOR FABRICATING THE CIRCUIT PLATE

TECHNICAL FIELD

The present invention relates to a method for fabricating a multilayer circuit board, a circuit plate, and a method for fabricating the circuit plate.

BACKGROUND ART

As electronic devices become denser in these days, there are demands for multilayering of circuit boards such as flexible printed-wiring boards used in those devices and reduction in line widths of circuits formed on the circuit boards. Build-up methods are used as a technique for multilayering such multilayer circuit boards. In build-up methods, resin layers made only of a resin and conductor layers are stacked on top of each other and interlayer connections are provided between the individual layers.

The build-up methods can be broadly classified into two groups: methods in which via holes are formed in resin layers and then interlayer connections are provided and method in which interlayer connections are formed and then resin layers are stacked. The interlayer connections are divided into those in which via holes are formed by plating and those in which via holes are formed by a conductive paste.

As a technique capable of providing stacked vias and increasing the density and simplifying wiring design, a method has been disclosed in which fine via holes for interlayer connections are formed in a resin layer by laser and are filled with a conductive adhesive such as a copper paste, and the conductive adhesive is used to provide electrical connection (see for example Japanese Laid-Open patent publication No. 8-316598).

However, this method is not always sufficiently reliable because layers are electrically interconnected by a conductive adhesive. Furthermore, because the method requires an advanced technique for filling small via holes with a conductive adhesive, it is difficult for the method to cope with finer wiring patterns.

Therefore, instead of the method of filling via holes with a conductive adhesive, a technique that uses metal protrusions (conductive posts) has been used. For example, a method has been disclosed in which when layers are interconnected, an interlayer adhesive is physically forced out and a conductive post and a connecting pad are interconnected (see for example Japanese Laid-open patent publication No. 11-54934).

However, this method is not sufficiently reliable in some cases because it is difficult to completely remove the interlayer adhesive from between a conductive post and a connecting pad.

One method for forming a multilayer substrate having finer circuit patterns is a bonding method using bump plating. For example, the following method is used to form a multilayer substrate.

A substrate 2 including a base 202 and a conductive post 204 which is protruding from the base 202 made of copper and a metal, or copper and an alloy, and a film 5 with interlayer adhesive are prepared (FIG. 2(a)). Then, the substrate 2 including the conductive post 204 and the film 5 with interlayer adhesive are bonded together by thermocompression (FIGS. 2(b), 2(c)).

Depending on the thicknesses and types of the interlayer adhesive 104 and a protective film 106, the protrusion of the conductive post 204 cannot completely be buried with the interlayer adhesive 104 and a void 602 can occur around the conductive post 204 (FIG. 2(d)).

After the protective film 106 is peeled off (FIG. 2(e)), the void 602 is left. The interlayer adhesive is removed with the protective film 106 when the protective film 106 is peeled off and a void 602 occurs around the conductive post where there is not the interlayer adhesive (FIG. 2(f)).

Then, a substrate 3 including a base 304 provided with a land 302 for connecting with the conductive post 204 is prepared (FIG. 2(f)). The substrate 2 including the conductive post 204 and the substrate 3 including the land 302 are bonded together through the interlayer adhesive 104 to provide a multilayer substrate 6 (FIG. 2(h)).

However, the void 602 not filled with the adhesive is not completely filled with the adhesive even by heat and pressure during pressure bonding between the layers but the void between the land 302 and the conductive post 604 remains (FIGS. 2(g), 2(h)).

As shown in FIG. 3, in the case of a substrate 2 having a complicated pattern shape with conductive posts 204 or a substrate 3 with conductive pads 302 having a complicated pattern shape, or a complicated conductor circuit or a highly dense circuit, an excessive or insufficient pressure can be applied to a portion of the pattern or circuit. As a result, the interlayer adhesive 104 can be left at the top portion 206 of a conductive post 204 because the conductive post 204 cannot completely force out the interlayer adhesive 104 (FIGS. 3(d), 3(e), 3(f), 3(g)). Consequently, metal bonding cannot provide an adequate electrical connection due to the interlayer adhesive 104 remaining between the conductive post 204 and the conductive pad 302 (FIG. 3(h)). Steps shown in FIGS. 3(a) to 3(c) are the same as those in FIG. 2.

A film 25 with interlayer adhesive is bonded by thermocompression to the circuit board 3 having a conductive pad 302 that receives a conductive post (FIGS. 8(a), 8(b)). In doing this, pressure applied to the circuit can be insufficient in the case of a complicated conductor circuit or dense circuit, like a circuit board 2 having conductive posts 104. Consequently, the interlayer adhesive 124 cannot be forced out but remain on the conductive pad 302 and the surface of the conductor circuit 306.

A substrate 211 obtained in FIG. 7(f) and a substrate 311 obtained in FIG. 8(c) are set in such a manner that the surface of the adhesive faces the substrate (FIG. 9(a)) and cured by heat to obtain a multilayer substrate 23 (FIG. 9(c)). However, an adequate electrical connection cannot be provided in some cases because the interlayer adhesive 104, 124 at the top portion 106 of a conductive pad covered by the adhesive, or the adhesive on a conductor circuit surface 302, 306 cannot completely be forced out (FIG. 9(b)) but remains (FIG. 9(c)).

There is a method in which an adhesive on conductive posts and on conductor circuits is removed by polishing in order to completely remove the adhesive on the conductive post and conductor circuit (for example see Japanese Laid-open patent publication No. 2000-059028). However, this method has a technical problem that the number of man-hours is increased because the step of polishing is added, and a high precision of polishing is required.

The following method is disclosed in Japanese Laid-open patent publication No. 8-195560. A conductive post having a solder layer formed on its top is used and the conductive post is passed through an uncured resin layer and an uncured adhesive layer at a temperature lower than the melting temperature of the solder. A pressure of approximately 2.5 MPa is applied to a connecting pad and then the adhesive layer is cured. The solder is melted and then cooled to form a solder bonding.

However, when fabricating a circuit board by making interlayer connections with pressure applied in this way, a phenomenon has occurred in which a circuit in an internal layer is deformed and the circuit board is heaved due to deformation of an internal layer circuit. There are tendencies that the deformation and heaves become especially noticeable as the number of internal circuit layers increases.

Patent Document 1: Japanese Laid-open patent publication No. 8-316598
Patent Document 2: Japanese Laid-open patent publication No. 11-54934
Patent Document 3: Japanese Laid-open patent publication No. 2000-059028
Patent Document 4: Japanese Laid-open patent publication No. 8-195560

DISCLOSURE OF THE INVENTION

The present invention has been made in light of the circumstances described above and provides a method for fabricating a multilayer circuit board, a circuit plate, or a method for fabricating the circuit plate that enable stable interlayer connections to be provided by using a simple process.

According to the present invention, there is provided a method for fabricating a multilayer circuit board, including: preparing a first film including a first protective film and a first interlayer adhesive stacked together; preparing a first circuit board including a first base and a conductive post protruding from said first base; stacking said first film and said first circuit board together so that said first interlayer adhesive and said conductive post are brought into contact with each other; peeling off said first protective film from said first interlayer adhesive while selectively removing said first interlayer adhesive at a top portion of said conductive post to expose said top portion; preparing a second circuit board including a conductive pad; and stacking and bonding said first circuit board and said second circuit board together through said first interlayer adhesive so that the exposed portion of said conductive post and said conductive pad are bonded together.

According to the present invention, there is also provided a method for fabricating a multilayer circuit board, including: preparing a first film including a first protective film and a first interlayer adhesive stacked together; preparing a first circuit board including a first base and a conductive post protruding from said first base; stacking said first film and said first circuit board together so that said first interlayer adhesive and said conductive post are brought into contact with each other; peeling off said first protective film from said first interlayer adhesive while selectively removing said first interlayer adhesive at a top portion of said conductive post to expose said top portion; preparing a second film including a second protective film and a second interlayer adhesive stacked together; preparing a second circuit board including a second base and a conductive pad disposed over one surface of said second base, said conductive pad receiving said conductive post; stacking said second film and said second circuit board together so that the surface of said interlayer adhesive and said conductive pad are brought into contact with each other; peeling off said second protective film from said second interlayer adhesive while selectively removing said second interlayer adhesive over a conductive surface of said conductive pad to expose said conductive surface; and stacking and bonding said first and second circuit boards together through said first and second interlayer adhesives so that said conductive post and said conductive pad face each other.

With the fabricating method described above, polishing, which increases the number of steps, does not need to be performed because the interlayer adhesive at the top portion of conductive posts or the interlayer adhesive on the conductive surface of conductive pads and at the top portion of conductive posts is selectively removed in the step of stacking the interlayer adhesive. In addition, because a high polishing precision is not required, a highly reliable multilayer circuit board can be obtained in a simple way.

There may be also provided a method for fabricating a circuit plate by etching a multilayer circuit board obtained by the method described above. Also, a circuit plate may be obtained by this method.

According to the present invention, a method for fabricating a multilayer circuit board, a circuit plate, and a method for fabricating the circuit plate that enable stable interlayer connections to be provided by a simple process.

BRIEF DESCRIPTION OF THE DRAWINGS

These and other objects, features, and advantages will be further apparent from the following description of preferred embodiments and the accompanying drawings.

BEST MODE FOR CARRYING OUT THE INVENTION

Figure 1:
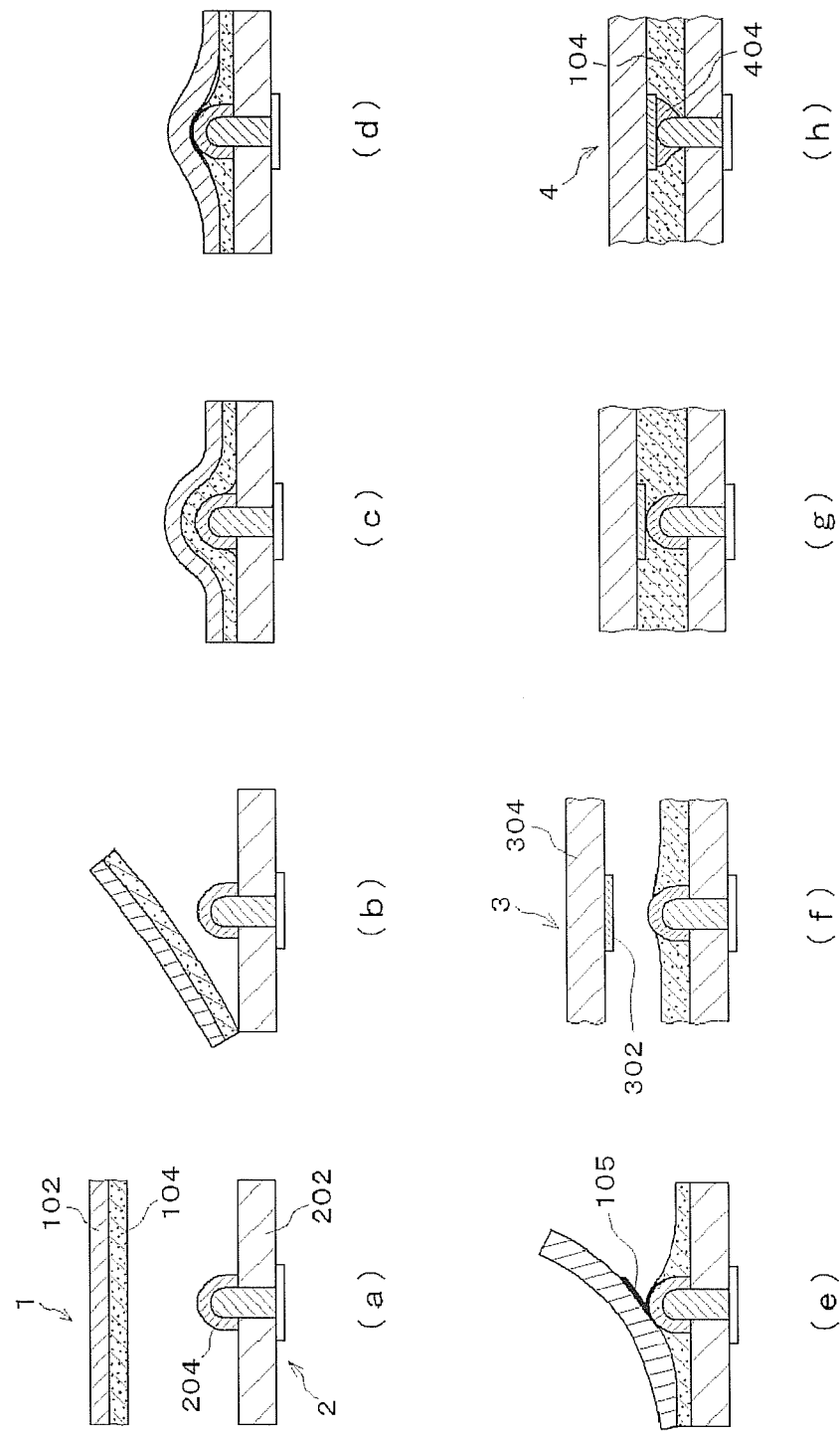
FIG. 1 is a cross-sectional view of a process for fabricating a multilayer circuit board showing one embodiment of the present invention.

Embodiments of the present invention will be described below with reference to drawings. Like components are labeled with like reference numerals throughout the drawings and detailed description will not be repeated in the following description.

FIG. 1 is a cross-sectional view showing one embodiment of a method for fabricating a multilayer circuit board according to the present invention. As shown in FIG. 1, the fabrication method includes steps given below. The method for fabricating a multilayer circuit board 4 (FIG. 1(h)) includes the steps of:

(1) preparing a first film 1 including a first protective film 102 and a first interlayer adhesive 104 stacked together (FIG. 1(a));

(2) preparing a first circuit board 2 including a base 202 and a conductive post 204 protruding from the base 202 (FIG. 1(a));

(3) stacking the first film 1 and the first circuit board 2 together in such a manner that the first interlayer adhesive 104 is brought into contact with the conductive post 204 (FIGS. 1(c), (d));

(4) peeling off the first protective film 102 from the first interlayer adhesive 104 while selectively removing the first interlayer adhesive at the top portion of the conductive post 204 to expose the top portion, and attaching a removed portion 105 to the first protective film 102 side (FIG. 1(e));

(5) preparing a second circuit substrate 3 including a conductive pad 302 (FIG. 1(f)); and (6) stacking and bonding the first circuit board 2 and the second circuit board 3 together through the first interlayer adhesive 104 so that the exposed portion of the conductive post 204 and conductive pad 302 are bonded together (FIGS. 1(g), 1(h)).

Each of the steps will be described below.

At the step of preparing a first film 1 including a first protective film 102 and a first interlayer adhesive 104 stacked together, the first interlayer adhesive 104 is applied to the first protective film 102 and is dried to form a protective film 1 with interlayer adhesive as in FIG. 1(a).

For ease of parting, it is preferable to use as the first protective film 102 at least one resin film selected from among a polyethylene terephthalate resin film, a polyethylene resin film, a polyimide resin film, a polyester resin film, a polypropylene resin film, and a polystyrene resin film.

Among these resin films, the polyethylene terephthalate resin film is most preferable in terms of economy.

The thickness of the first protective film 102 is preferably equal to or more than 3 µm and equal to or less than 25 µm. More preferably, the thickness of the first protective film 102 is equal to or more than 9 µm and equal to or less than 15 µm. If the thickness of the first protective film 102 is in this range, the protrusion of the conductive post can be reliably buried and the first protective film 102 can be easily peeled off.

The thickness of the first interlayer adhesive 104 is preferably less than the height of the protruding portion of a conductive post 204 from the substrate. If the thickness of the first interlayer adhesive 104 is less than the height of the conductive post 204, the first interlayer adhesive 104 can be easily removed from the top portion 206 of the conductive post when the first protective film 102 is removed from the top of the conductive post 204.

Then, a first circuit board 2 including a conductive post 204 is prepared. The base 202 may be a resin film such as a polyether ether ketone film or a polyether sulfone film, or a cured resin such as polyimide resin, epoxy resin, phenol resin, cyanate resin, or liquid crystalline polymer, or a multilayer plate of these. Among these materials, a resin film represented by a polyimide film is preferable. This can improve the heat resistance and, in addition, provide flexibility. The height of the portion of the conductive post 204 protruding from the surface of the base is preferably more than the thickness of the interlayer adhesive 104 as described above.

The thickness the base is not limited to a specific value but is preferably equal to or more than 9 µm and equal to or less than 50 µm and especially preferably equal to or more than 12 µm and equal to or less than 25 µm. If the thickness is within this range, the time required for plating for forming the conductive post can be reduced.

The step of stacking the first interlayer adhesive 104 and the conductive post 204 will be described next (FIGS. 1(b), 1(c), 1(d)).

The first interlayer adhesive 104 is soften by heating in a vacuum laminator or the like and the protruding portion of the conductive post 204 is buried with the first interlayer adhesive 104 without leaving voids by applying pressure (FIG. 1(d)). The first interlayer adhesive 104 at the top portion 206 of the conductive post buries the conductive post 204 to the height of the protrusion but a thin layer of the first interlayer adhesive 104 remains at the top portion 206 of the conductive post.

The step of peeling off the first protective film 102 (FIG. 1(e)) will be described next. The first protective film 102 is peeled off in the state where the stack of the first interlayer adhesive 104 and the conductive post 204 are stacked (Fig. (d)). The angle at which the first protective film 102 is peeled off is preferably approximately 180 degrees. The closer the peeling angle is to 180 degrees, the smaller the peeling force is and the more uniformly the first adhesive 104 can be left on the surface of the base 202 on the first circuit board 2 side without being peeled off. When the first protective film 102 is removed, the first interlayer adhesive 104 at the top portion 206 of the conductive post sticks to the first protective film 102 and is removed together with peeling off of the first protective film 102 because the first interlayer adhesive 104 at the top portion 206 of the conductive post 204 is thin. On the other hand, the top portion 206 of the conductive post 204 is exposed and can be connected to a conductive pad in a stable manner.

Then, a second circuit board 3 including a conductive pad 302 that receives the conductive post 204 is prepared. The material of the base 304 may be the same as or different from that of the first circuit board 2.

The step of stacking and bonding the first circuit board 2 and the second circuit board 3 together through the first interlayer adhesive 104 so that the conductive post 204 faces the conductive pad 302 (FIGS. 1(f), 1(g)) will be described.

Figure 4:
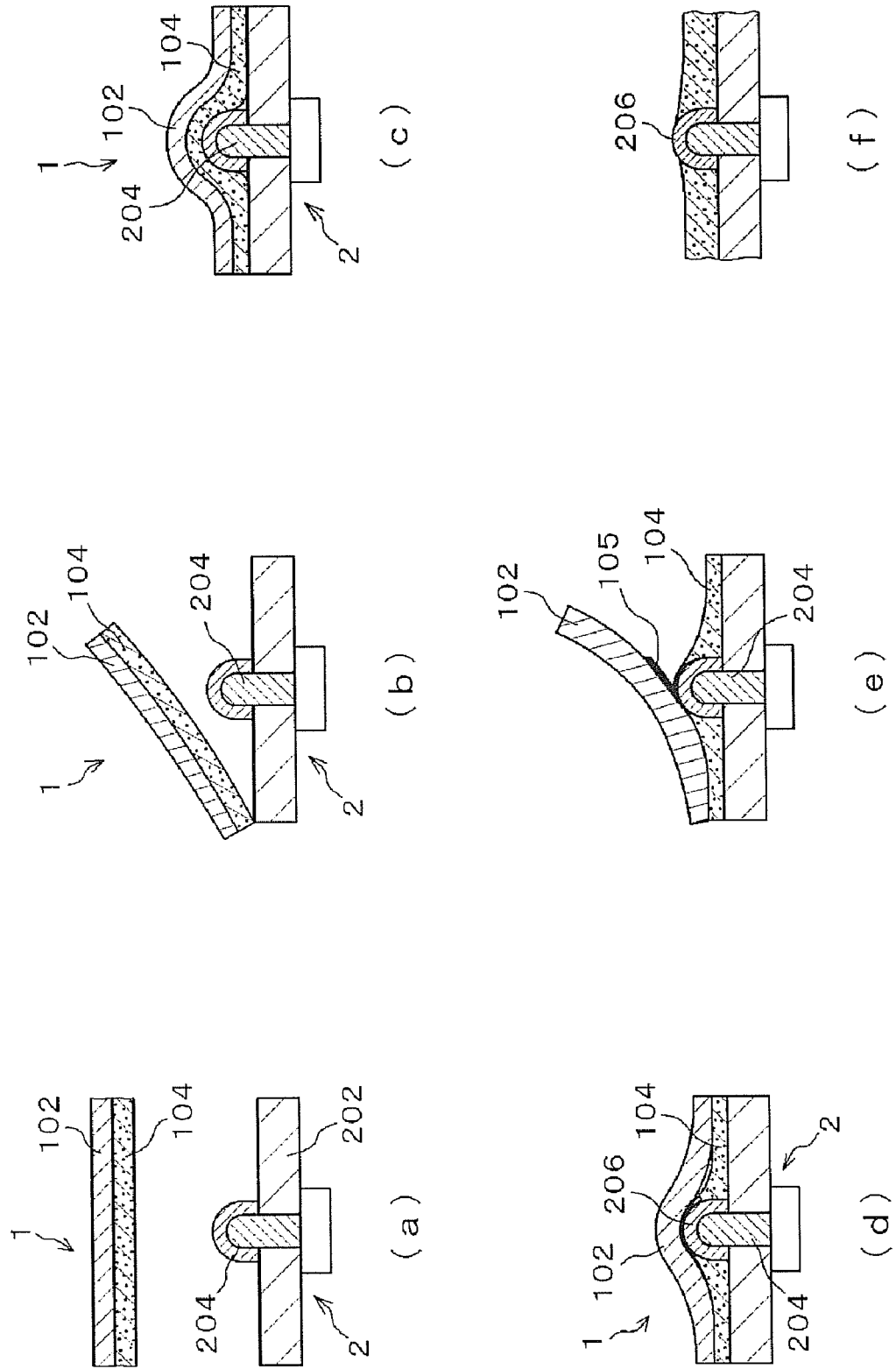
FIG. 4 is a cross-sectional view of a process for fabricating a circuit board showing one embodiment of the present invention.
Figure 5:
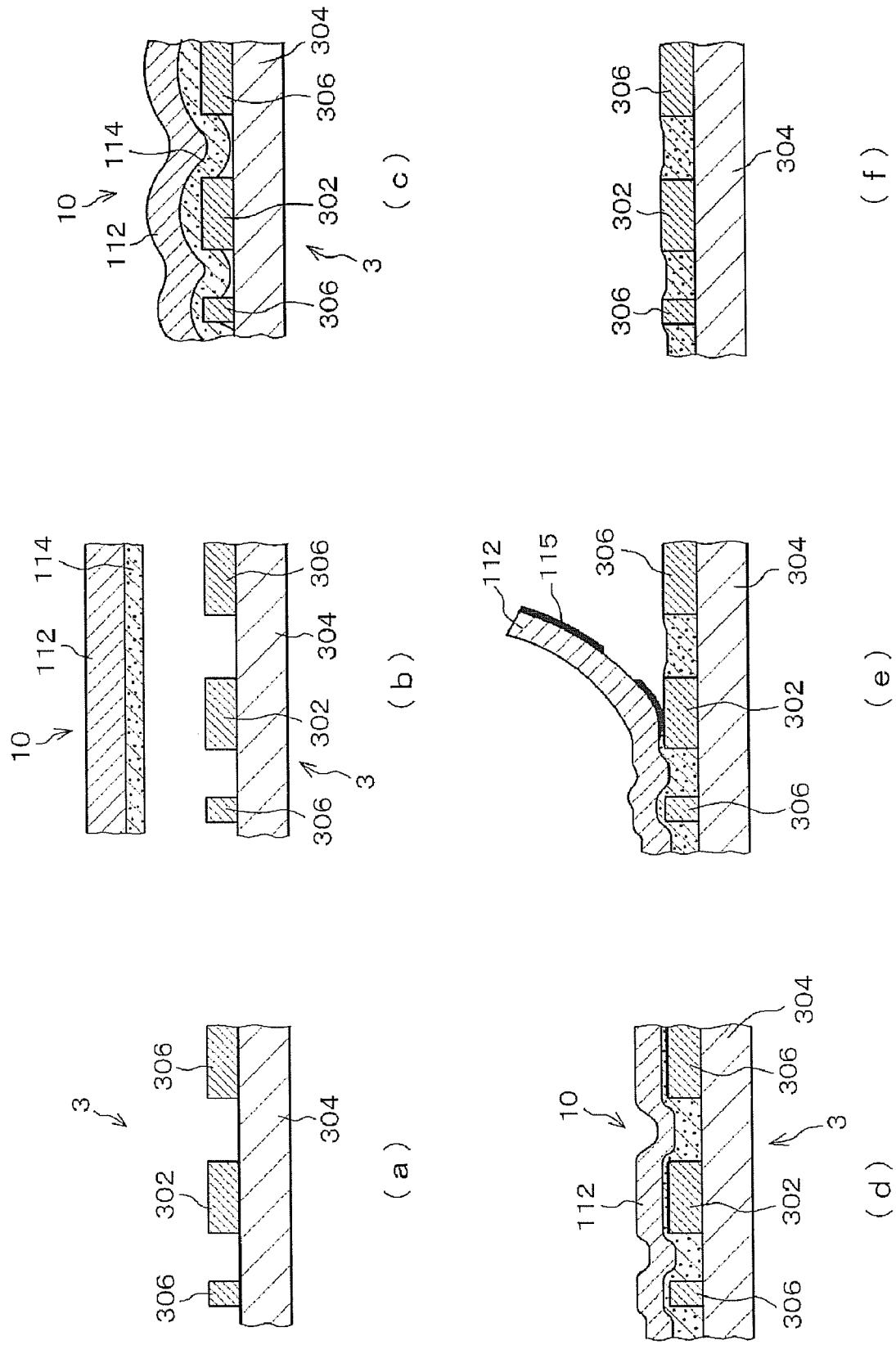
FIG. 5 is a cross-sectional view of a process for fabricating a circuit board showing one embodiment of the present invention.
Figure 6:
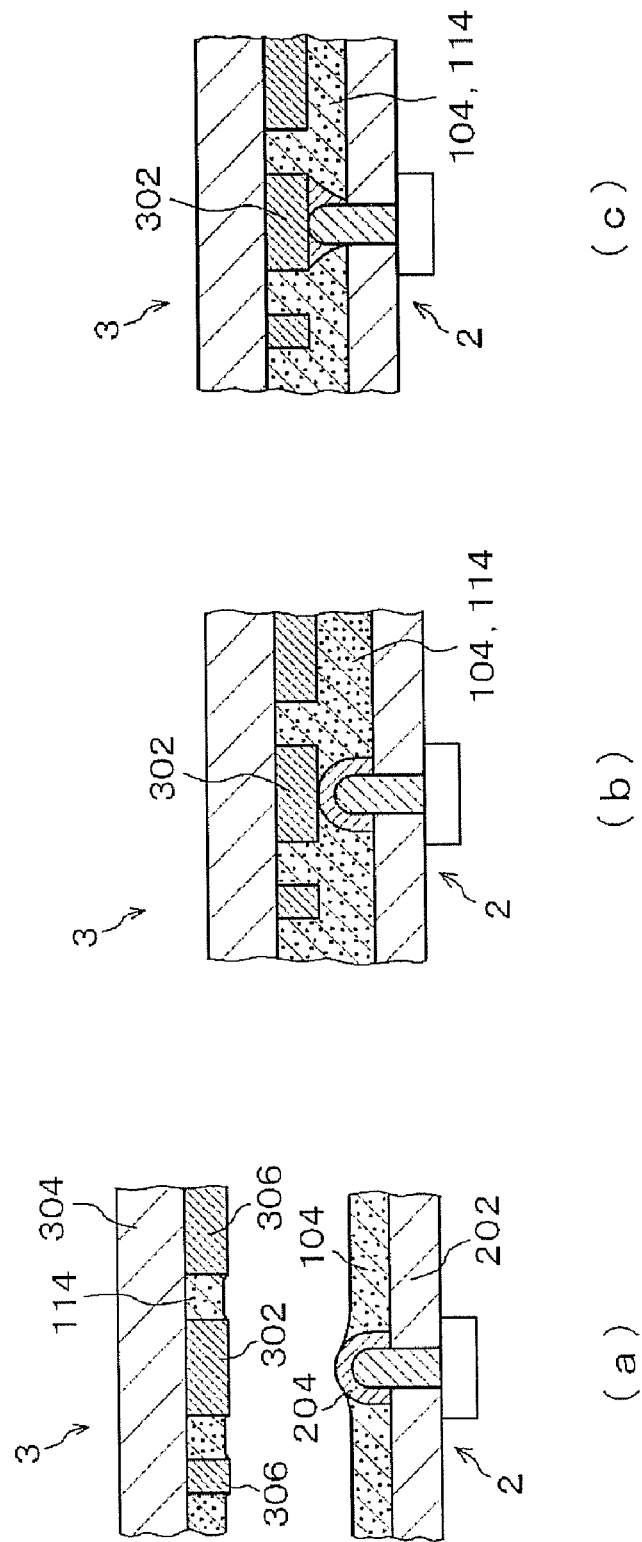
FIG. 6 is a cross-sectional view of a process for fabricating a multilayer circuit board showing one embodiment of the present invention.
Figure 7:
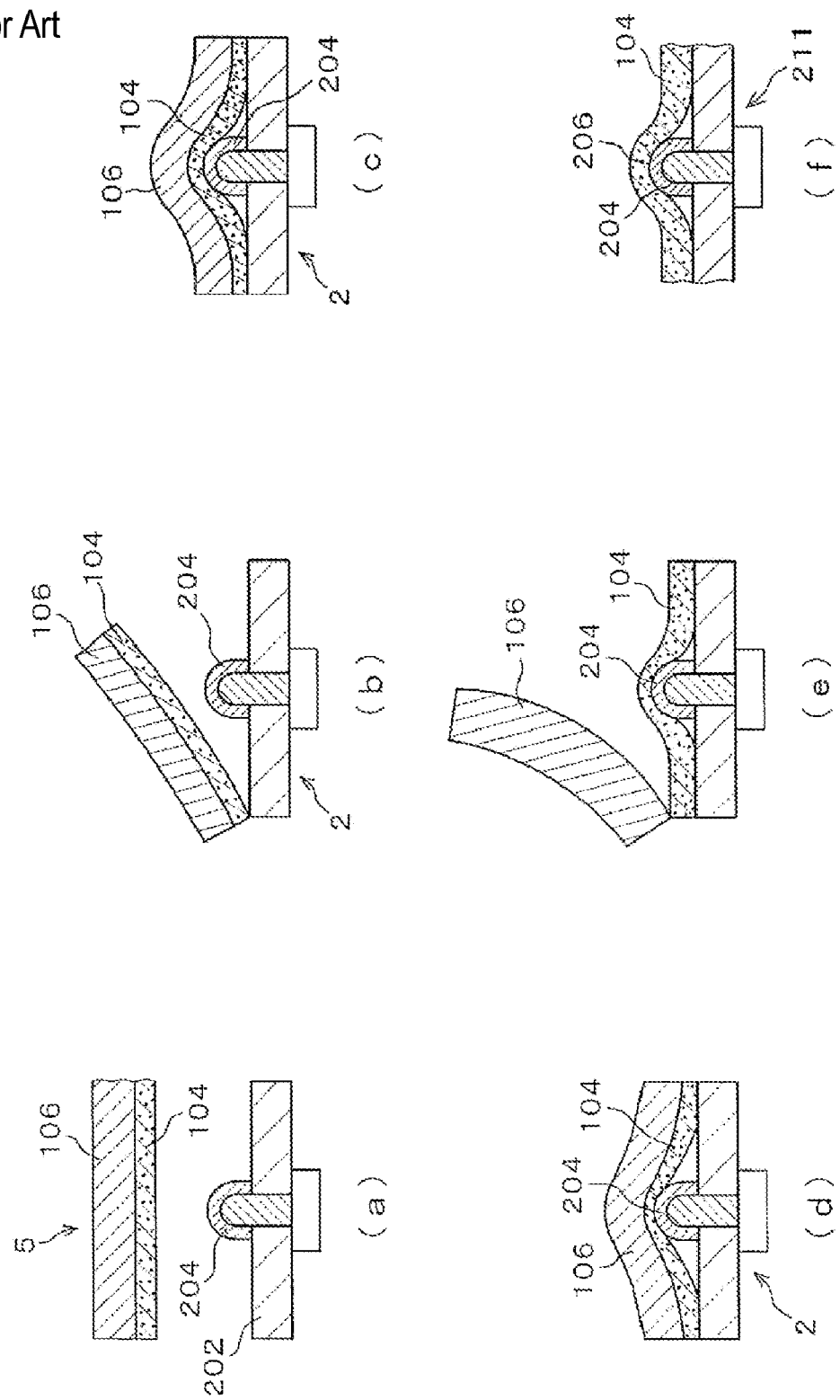
FIG. 7 is a process cross-sectional view illustrating a method for fabricating a circuit board according to a related art.
Figure 8:
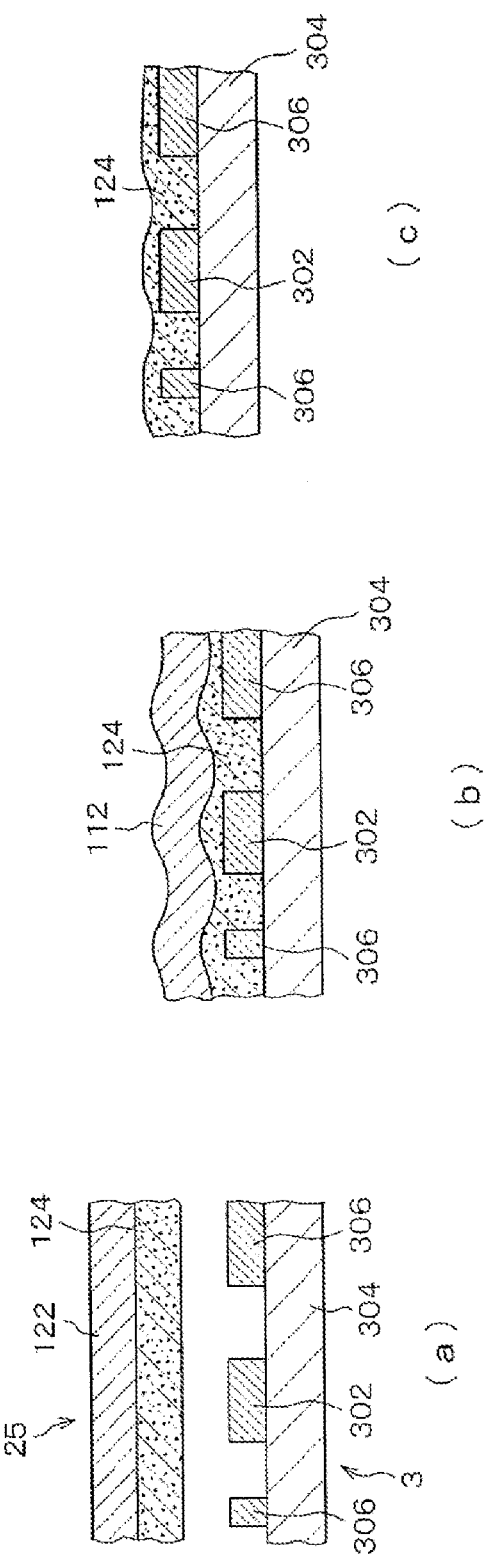
FIG. 8 is a process cross-sectional view illustrating a method for fabricating a circuit board according to a related art.
Figure 9:
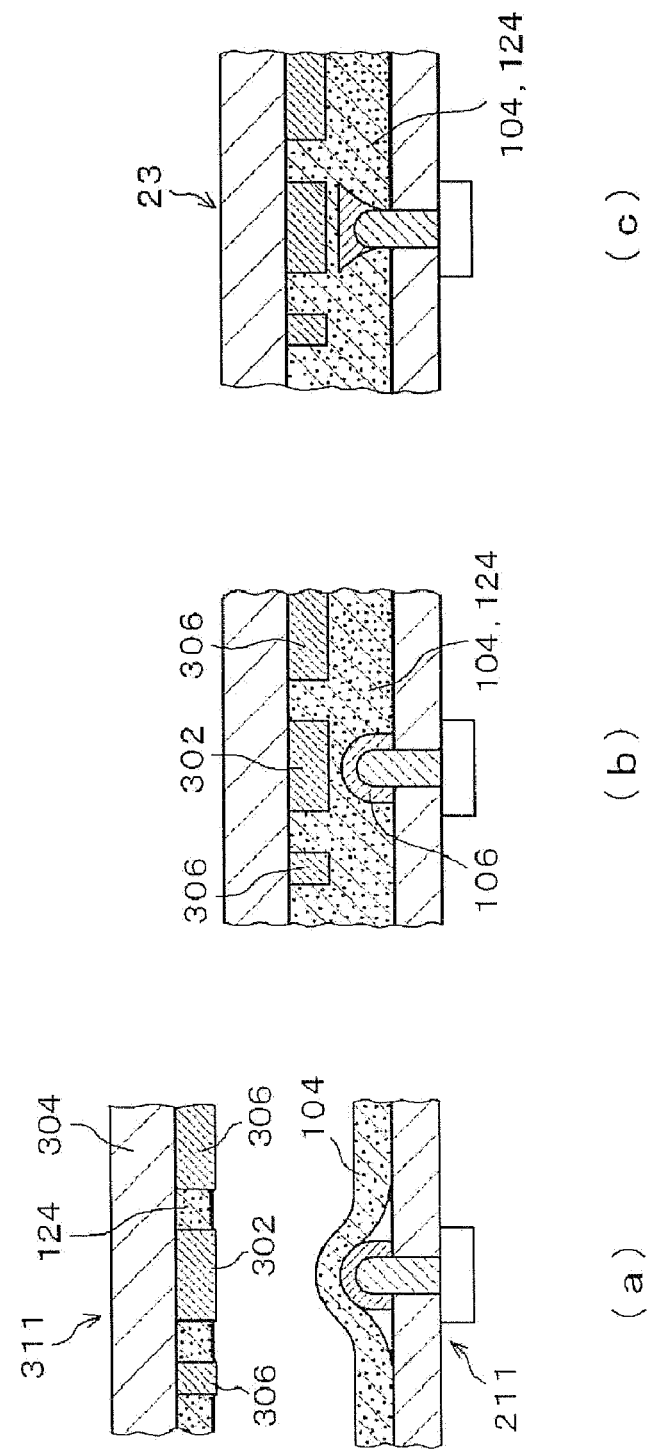
FIG. 9 is a process cross-sectional view illustrating a method for fabricating multilayer circuit board according to a related art.

To align the conductive post 204 and the conductive pad 302 with each other, a method may be used such as an alignment method in which an alignment mark formed as a conductor pattern beforehand is read by an image recognition apparatus or a method that uses alignment pins to achieve alignment. Then, the conductor pattern on the second circuit board 3 is buried with the first interlayer adhesive 104 and shaped by heating under a pressure in a vacuum. The temperature is raised until solder melts to electrically bond the conductive post 204 to the conductive pad 302 (FIG. 1(h)). Another embodiment of the present invention will be described next. FIGS. 4 to 6 are cross-sectional views illustrating a method for fabricating a multilayer circuit board in the present embodiment.

The fabricating method includes steps given below as shown in FIGS. 4 to 6.

The method for fabricating a multilayer circuit board includes the steps of:

(1) preparing a first film 1 including a first protective film 102 and a first interlayer adhesive 104 stacked together (FIG. 4(a));

(2) preparing a first circuit board 2 including a first base 202 and a conductive post 204 protruding from the first base 202 (FIG. 4(a));

(3) stacking the first film 1 and a first circuit board 2 together in such a manner that the first interlayer adhesive 104 is brought into contact with the conductive post 204 (FIGS. 4(*b*), (*c*), (*d*));
(4) peeling off the first protective film 102 from the first interlayer adhesive 104 and selectively removing the removed portion 105 and the first interlayer adhesive 104 of the top portion 206 of the conductive post 204 to expose the top portion 206 (FIG. 4(*e*), 4(*f*));
(5) preparing a second film 10 including a second protective film 112 and a second interlayer adhesive 114 stacked together (FIG. 5(*b*));
(6) preparing a second circuit board 3 including a second base 304 and a conductive pad 302 receiving the conductive post 204 on one surface of the second base 304 (FIG. 5(*a*));
(7) stacking the second film 10 and the second circuit board 3 so that the surface of the second interlayer adhesive 114 is brought into contact with the conductive pad 302 (FIGS. 5(*b*), (*c*), (*d*));
(8) peeling off the second protective film 112 from the second interlayer adhesive 114 while selectively removing removed portion 115 of the second interlayer adhesive 114 on the conductive surface of the conductive pad 302 to expose the conductive surface (FIGS. 5(*e*), 5(*f*)); and
(9) stacking and bonding the first and second circuit boards 2, 3 through the first and second interlayer adhesives 104, 114 so that the conductive post 204 and the conductive pad 302 face each other (FIGS. 6(*a*), 6(*b*), 6(*c*)).

The steps will be described below.

For the steps of preparing a first film 1 including a first protective film 102 and a first interlayer adhesive 104 stacked together (FIG. 4(*a*)), preparing a first circuit board 2 including a conductive post 204, stacking the first interlayer adhesive 104 and the conductive post 204 together (FIGS. 4(*b*), 4(*c*), 4(*d*)), and peeling off the first protective film 102 (FIG. 4(*e*)), the same steps described earlier can be used.

Then, a second circuit board 3 including a conductive pad 302 receiving the conductive post 204 is prepared (FIG. 5(*a*)). The material of the base 304 may be the same as or different from that of the first circuit board 2. Because heat is applied when the conductive post 204 and the conductive pad 302 are stacked together, internal stress is likely to occur because of expansion and shrinkage of the materials. Therefore, it is preferable to use materials having an equal thermal expansion coefficient because occurrence of internal stress can be prevented.

At the step of preparing a protective film 10 with interlayer adhesive including a second protective film 112 and a second interlayer adhesive 114 stacked together, the second interlayer adhesive 114 is applied onto the second protective film 112 and is dried to form a protective film 10 with interlayer adhesive as shown in FIG. 5(*b*). For the second interlayer adhesive 114, a material that is less adhesive to conductors than to insulators is used. If the second interlayer adhesive 114 is more adhesive to conductors than to insulators, a large amount of interlayer adhesive 114 will be left on the conductive pad 302 when the second protective film 112 is peeled off.

The same resin film as the protective film given above can be preferably used as the second protective film 112. Among the resin films, the polyethylene terephthalate resin film is most preferable in terms of economy.

The thickness of the second protective film 112 is preferably equal to or more than 25 µm and equal to or less than 50 µm. More preferably, the thickness of the second protective film 112 is equal to or more than 33 µm and equal to or less than 43 µm. If the thickness of the second protective film 112 is within this range, the gaps between conductive pads can be reliably filled and the second protective film 112 can be easily peeled off without causing damage when the second protective film 112 is removed.

The thickness of the second interlayer adhesive 114 is preferably equal to or more than a half of the thickness of the conductive pad 302 and equal to or less than the thickness of the conductive pad. If the second interlayer adhesive 114 is too thin, the interlayer adhesive 114 cannot fill the gaps between the conductive pads and voids are likely to occur. If the second interlayer adhesive 114 is too thick, the interlayer adhesive 114 will be in excess and thickly exist on the conductive pad 302. Consequently, a large amount of second interlayer adhesive 114 will likely to be left on the conductive pad 302 when the second protective film 112 is peeled off.

The step of stacking the second interlayer adhesive 114 and the conductive pad 302 will be described next (FIGS. 5(*c*), 5(*d*)).

Figure 2:
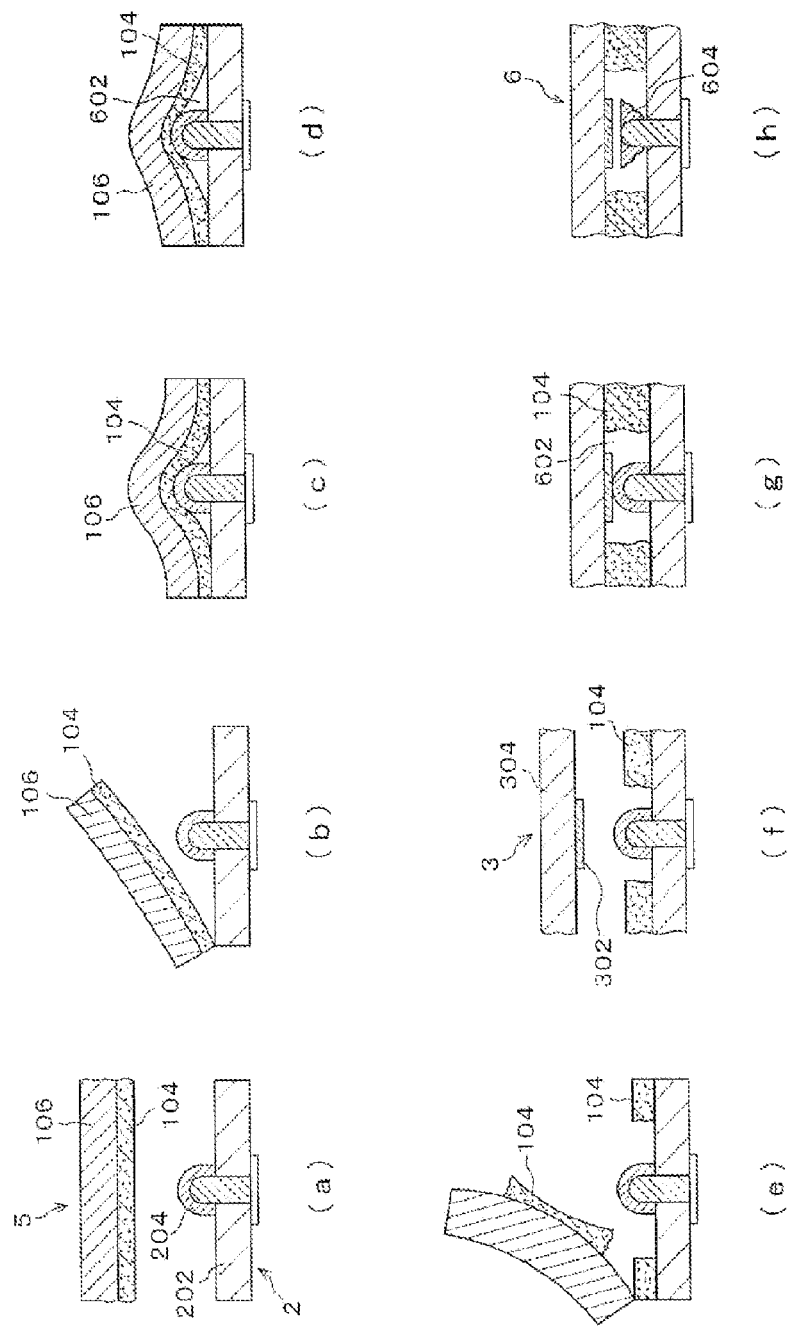
FIG. 2 is a cross-sectional view of a process for fabricating a multilayer circuit board showing an example of related art.

The second interlayer adhesive 114 is soften by heat by vacuum pressing or the like, and the gaps between the conductive pads 302 are filled with the second interlayer adhesive 114 under pressure without leaving voids (FIG. 2(*c*)). Because the second interlayer adhesive 114 on the conductive pads 302 flows into the gap between conductive pads 302, the thickness of the interlayer adhesive 114 on the conductive pads 302 is thinner than the original thickness. The second interlayer adhesive 114 adheres to the second protective film 112 by heat under pressure. In order to stabilize the adhesion, they are preferably stored in a low-humidity environment for 24 hours or more.

The step of peeling off the second protective film 112 (FIG. 5(*d*)) will be described next. The second protective film 112 is peeled off in the state where the second interlayer adhesive 114 and the conductive pad 302 are stacked (FIG. 5(*d*)). The angle at which the second protective film 112 is peeled off is preferably approximately 180 degrees. The closer the peeling angle is to 180 degrees, the smaller the peeling force is and the more uniformly the second film 112 can be removed. Because the second interlayer adhesive 114 is more adhesive to insulators than to conductors, a large amount of second interlayer adhesive 114 is left on the surface of the base 304 on the second circuit board 3 side and the second interlayer adhesive 114 is removed in the state where the second interlayer adhesive 114 sticks to the second protective film 112 side to partially expose the conductive pad on the conductive pad 302. By using this method, a circuit board 30 having a uniform thickness of an interlayer adhesive 114 can be provided regardless of the percentage of conductor in the second circuit board 3.

The step of stacking and bonding the first and second circuit boards 2, 3 through the first and second interlayer adhesives 104, 114 so that the conductive post 204 and the conductive pad 302 face each other (FIGS. 6(*a*), 6(*b*), 6(*c*)) will be described.

To align the conductive post 204 and the conductive pad 302 with each other, a method may be used such as an alignment method in which an alignment mark formed as a conductor pattern beforehand is read by an image recognition apparatus or a method that uses alignment pins to achieve alignment. Then, the conductor pattern on the second circuit board 3 is buried with the first interlayer adhesive 104 and shaped by heating under a pressure in a vacuum. The temperature is raised until solder melts to electrically bond the conductive post 204 to the conductive pad 302 (FIG. 6(*c*)).

A method for fabricating a circuit plate including the step of etching the multilayer circuit board thus provided can be contemplated. By these methods, a reliable circuit board can be fabricated at low cost because these methods do not need polishing, which would increase the number of steps, and do not need a high precision of polishing.

Yet another embodiment of the present invention will be described below with reference to drawings.

The steps will be described below.

Figure 10:
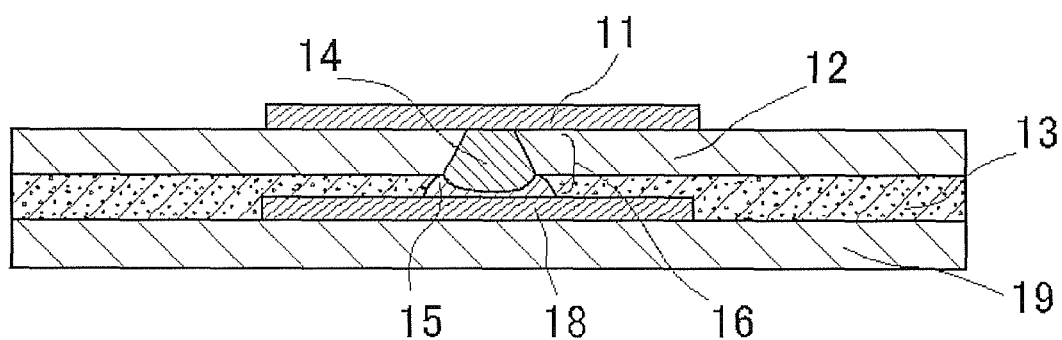
FIG. 10 is a cross-sectional view of a multilayer circuit board showing one embodiment of the present invention.
Figure 11:
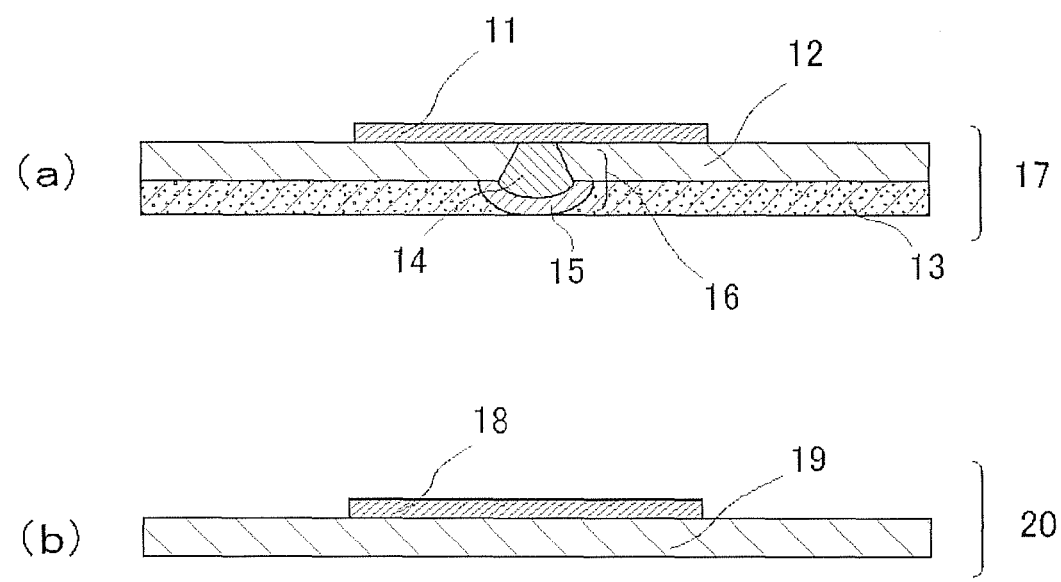
FIG. 11 is a cross sectional view of a circuit board showing one embodiment of the present invention.

FIGS. 10 and 11 are cross-sectional views showing one embodiment of a method for fabricating a multilayer circuit board according to the present invention. FIG. 10 is a cross-sectional view of a multilayer circuit board obtained according to the present embodiment. FIG. 11(a) is a cross-sectional view of a first substrate and FIG. 2(b) is a cross-sectional view of a second substrate.

First, a first substrate 17 including a first base 12 and a conductive post 16 and a second substrate 20 including a second base 19 and a second conductive pad 18 receiving the conductive post 16 are prepared (FIGS. 2(a), 2(b)).

The first and second bases 12, 19 may be made of those similar to the materials given earlier. The materials of the first and second bases may be the same or different. The thicknesses of the first and second bases may also be the same or different.

The first conductive pad 11 and the second conductive pad 18 may be made of a material, for example, such as a copper foil or aluminum. Among the materials, the copper foil is preferable. The thickness is preferably equal to or more than 5 μm and equal to or less than 30 μm and especially preferably equal to or more than 9 μm and equal to or less than 22 μm. If the thickness is within these ranges, a good circuit formation ability, in particular, by etching can be obtained and a good handling ability of the base 12 after the first conductive pad 11 and the second pad 18 are formed can also be obtained.

The percentage of the area occupied by the second conductive pad 18 to the area of the surface of the second substrate on which the second conductive pad 18 is formed is preferably equal to or more than 30% and equal to or less than 70% and especially preferably equal to or more than 40% and equal to or less than 50%. If the percentage is too small, the handling ability of the second substrate 20 can degrades; if the percentage is too large, the interlayer adhesive 13 between the conductive post 16 and the second conductive pad 18 is difficult to be forced out and the stability of the bonding can decrease.

The conductive post 16 includes a conductive post main body 14 and a metal coating layer 15 that covers the conductive post main body. The conductive post main body 14 of the conductive post 16 is formed first by pasting or plating. The conductive post main body 14 preferably protrudes to a height equal to or more than 5 μm and equal to or less than 10 μm from the surface opposite to the surface of the first base 12 on which the first conductive pad 11 is formed. If the height is within the range, the time required for plating can be reduced and a high interlayer smoothness between the first substrate 17 and the second substrate 20 can be provided.

Then, the metal coating layer 15 is formed of a material such as an alloy. Thus, a conductive post including a conductive post main body and a metal coating layer covering the conductive post main body is formed. The height of the protruding portion of the conductive post 16 is preferably equal to or more than 15 μm and equal to or less than 30 μm from the surface of the first base 12 that is opposite to the surface on which the first conductive pad 11 is formed. If the height is within this range, a high stability of bonding between the conductive post 16 and the second conductive pad 18 can be achieved.

The metal coating layer 15 is made of a metal or an alloy, for example. The metal is preferably tin, for example. The alloy of the metal coating layer 15 is preferably an alloy including at least two metals or more selected from the group consisting of tin, lead, silver, zinc, bismuth, antimony, and copper. For example, the alloy may be a tin-lead-based, tin-silver-based, tin-zinc-based, tin-bismuth-based, tin-antimony-based, tin-silver-bismuth-based, or tin-copper based alloy but is not limited to specific combinations and compositions of metals. Any appropriate alloy may be selected.

The material of the interlayer adhesive 13 may be an adhesive such as epoxy resin adhesive or an acrylic resin adhesive, for example. Among them, an epoxy resin adhesive that is flux-active is preferable. This removes an oxide film on the surface of the metal coating layer 15 and the second conductive pad 18, thereby improving the stability of bonding between the conductive post 16 and the second conductive pad 18. Using a polyimide film is as the first base 12 especially improves the adhesion.

The thickness of the interlayer adhesive 13 is preferably equal to or more than the height of the portion of the conductive post main body 14 that protrudes from the first base 12 and equal to or less than the height of the portion of the conductive post 16 that protrudes from the first base 12. If the thickness is in this range, an especially high stability of bonding between the conductive post 16 and the second conductive pad 18 and both good adhesion and a high level of inhibition of seepage of the adhesive can be achieved. Furthermore, if the thickness is within the range given above, the second conductive pad 18 is adequately buried with the interlayer adhesive 13 without leaving voids.

The interlayer adhesive 13 can be stacked on the first base 12 by a method such as applying the adhesive in liquid form to the first base 12 or heating and pressing in a vacuum laminator. The latter method is simpler and provides a stable thickness of the interlayer adhesive 13.

The step of removing the interlayer adhesive 13 from between the metal coating layer 15 and the second conductive pad 18 to provide electrical connection between the first substrate 16 and the second substrate 20 will be described next.

To align the first substrate 17 and the second substrate 20 with each other beforehand, a method is used such as a method in which a mark formed as a conductor pattern is read by an image recognition apparatus or a method that uses alignment pins to align the substrates with each other. The aligned substrates are pressed in a vacuum at a predetermined temperature and pressure.

The predetermined temperature is provided preferably by heating a heat plate to a temperature in the range from approximately 230° C. to approximately 280° C. beforehand, especially preferably to a temperature in the range from approximately 250° C. to approximately 270° C. If the temperature is in these ranges, the interlayer adhesive 13 can be forced out from between the metal coating layer 15 and the conductive pad 18 because the interlayer adhesive 13 soften to a viscosity in the range from approximately 10 Pa·S to approximately 400 Pa·S. At the same time, the first substrate 17 and the second substrate 20 can be prevented from being deformed or being heaved due to deformation, because the metal coating layer 15 melts and concentration of pressure at the conductive post 16 is reduced. In addition, a good fillet is formed and therefore the electrical connection between the first substrate 17 and the second substrate 20 is stabilized.

The predetermined pressure mentioned above is preferably in the range from approximately 0.5 MPa to approximately 2 MPa and especially preferably in the range from approximately 1.5 MPa to approximately 2 MPa. If the pressure is in these ranges, the interlayer adhesive 13 can be forced out from between the metal coating layer 15 and the second conductive pad 18. If the pressure is too low, it may be impossible to completely force out the interlayer adhesive 13. If the pressure is too high, the first substrate 17 and the second substrate 20 can be deformed and can be heaved due to deformation. In addition, an amount of seepage of the interlayer adhesive increases and the interlayer thickness can become unstable.

While embodiments of the present invention have been described with reference to the drawings, these are illustrative of the present invention and various other configurations can be used.

For example, while the step of stacking and bonding the first and second circuit boards has been described in the present embodiment, a method for fabricating a multilayer circuit board may be contemplated in which conductive pads are formed on a first circuit board and a second circuit board including conductive posts is stacked and bonded on an upper layer of the first circuit board. In this way, multiple layers may be added to a desired first or second circuit board.

EXAMPLES

In the following experimental examples, multilayer circuit boards have been fabricated and the bonding ratios of the circuit boards obtained have been measured.
[Measurement of Bonding Ratios]
An electrical continuity tester is used to measure the electrical continuity of each bonding point on multilayer circuit boards. The bonding ratio is represented by the ratio of the number of electrically continuous bondings (electrical continuity ratio) to the number of all bondings. If all the points are electrically continuous, then the bonding ratio is 100%.

Experimental Example A1

The example was implemented by following the process described with respect to FIG. 1.

That is, a 12-μm-thick polyethylene terephthalate film was prepared as a protective film and a 13-μm-thick interlayer adhesive was applied to it and dried. Then, vias of 50 μm in diameter was formed in a two-layer single-sided circuit board (SE1310 from Ube Industries, Ltd.) including a 12-μm-thick copper foil and a 25-μm-thick polyimide film as a base by irradiating with UV laser from the side opposite to the copper foil. The height of plating, protruding amount from the base, was 23 μm and a circuit was formed by etching. This substrate with conductive posts and the film with interlayer adhesive were bonded together by thermocompression in a vacuum laminator at 120° C. and 0.4 MPa. Then, as the protective, polyethylene terephthalate film was peeled off at an angle of 180 degrees to form a circuit board in which the interlayer adhesive was selectively removed from the top portion of the conductive posts. Then, a two-layer double-sided circuit board (PKW1012ECU from Arisawa Manufacturing Co., Ltd.) including a 12-μm-thick copper foil and a 25-μm-thick polyimide film as a base was etched to form a circuit. In this way, a first circuit substrate including conductive posts was formed.

A second circuit board including conductive pads was also prepared.

Then, the two circuit boards were automatically aligned with each other by image recognition using conductor patterns and bonded together by vacuum thermocompression first at 150° C. and 0.8 MPa for 90 seconds, then at 270° C. and 0.3 MPa.

Experimental Example A2

A polyimide resin film was used as a protective film to form a multilayer circuit board in which an interlayer adhesive at the top of conductive posts was selectively removed by following the process shown in FIG. 1.

Experimental Example A3

A 50-μm-thick polyethylene terephthalate film was used to form a circuit board by following the process shown in FIG. 2. Because the protective film was thick, the protective film could conform to the shape of protruding conductive posts and a large portion of the interlayer adhesive was taken by the protective film as shown in FIG. 2(e) at the step of peeling off the protective film. It was confirmed that a multilayer circuit board was formed in which a large portion of the interlayer adhesive around the conductive post was removed to cause a void after stacking and bonding as shown in FIG. 2(h).

Experimental Example A4

Figure 3:
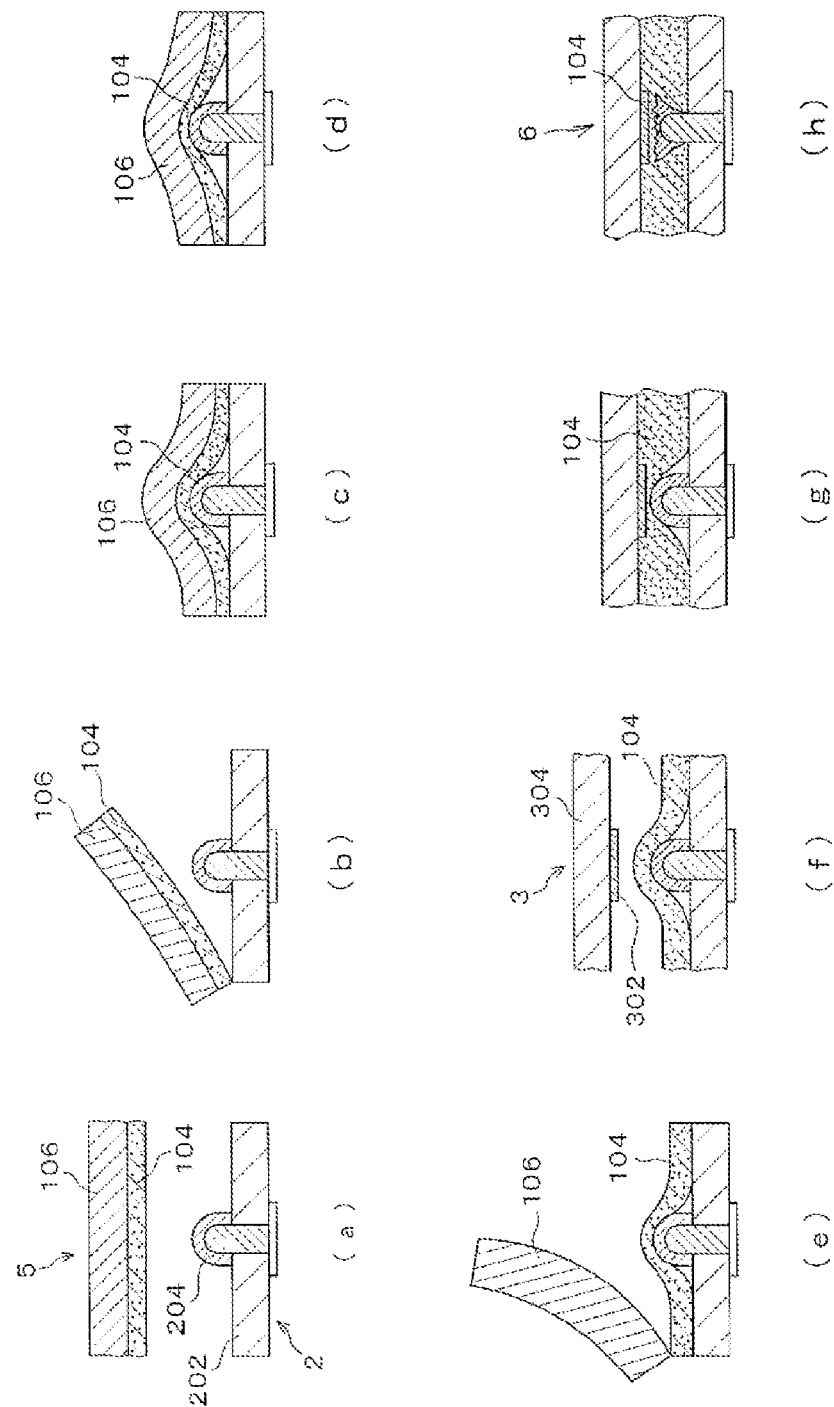
FIG. 3 is a cross-sectional view of a process for fabricating a multilayer circuit board showing an example of related art.

A 30-μm-thick interlayer adhesive was used to form a circuit board by following the process shown in FIG. 3. Because the interlayer adhesive was thick, the interlayer adhesive remained at the top of protruding conductive posts. At the step after the protective film was peeled off, the interlayer adhesive was left at the top portion of a conductive post as shown in FIG. 3(f). After stacking and bonding, it was confirmed that a multilayer circuit board was formed in which the interlayer adhesive remained between the conductive post and conductive pad as shown in FIG. 3(h).

Table 1 shows resulting electrical bonding ratios of the substrates fabricated by the processes of the methods in experimental examples A1 to A3. Experimental examples A1 and A2 show good bonding ratios whereas experimental example A3 shows a low bonding ratio because the void expanded during bonding due to the void around the bonding portion between the conductive post and conductive pad. Experimental example A4 also shows a low bonding ratio because of the interlayer adhesive existing between the conductive post and conductive pad.

TABLE 1

|  | Bonding ratio |
| --- | --- |
| Experimental example A1 | 100% |
| Experimental example A2 | 100% |
| Experimental example A3 | 50% |
| Experimental example A4 | 10% |

Experimental Example B1

The example was implemented by following the process described with reference to FIGS. 4 to 6.

A first circuit board including conductive posts was formed by the same method as that in the experimental example A1.

Then, a 38-μm-thick polyethylene terephthalate film was prepared as the protective film and an interlayer adhesive was applied to the film to a thickness of 8 μm by a coater and was dried. This two-layer double-sided circuit board and the film with interlayer adhesive were bounded together by thermocompression at 150° C. and 0.8 MPa and then left in an environment at a humidity of less than or equal to 10% for 24 hours. Then the protective film was peeled off at an angle of 180 degrees to form a circuit board in which the interlayer adhesive on conductive pads was selectively removed. In this way, a second circuit board including conductive pads was formed.

Then, the two circuit boards were automatically aligned with each other by image recognition using conductor patterns and were bounded together by thermocompression in a vacuum first at 150° C. and 0.3 MPa for 90 seconds and then at 260° C. and 0.3 MPa.

Experimental Example B2

A polyimide resin was used as the protective film to form a circuit board in which an interlayer adhesive on conductive pads was selectively removed by following the process shown in FIG. 5. The rest of the method was the same as that in experimental example B. Thus, a multilayer circuit board was fabricated.

Experimental Example B3

A multilayer circuit board was fabricated by using the same method as that in experimental example B1, except that the thickness of the interlayer adhesive stacked on the two-layer double-sided circuit board was 12 μm.

Experimental Example B4

A multilayer circuit board was fabricated by the same method as that in experimental example B1, except that the interlayer adhesive stacked on the two-layer double-sided circuit board has approximately equal adhesibility to conductors and insulators. It was confirmed that a slight amount of interlayer adhesive was left on conductive pads when the protective film was peeled off.

Table 2 shows resulting electrical bonding ratios of the multilayer circuit boards fabricated by the processes in experimental examples B1 to B4. Experimental examples B1 to B4 show good electrical bonding ratios.

TABLE 2

|  | Bonding ratio |
| --- | --- |
| Experimental example B1 | 100% |
| Experimental example B2 | 100% |
| Experimental example B3 | 100% |
| Experimental example B4 | 80% |

Experimental Example C1

The example was implemented by following the process described with reference to FIGS. 10 and 11.

That is, a two-layer single-sided circuit board (SE1310 from Ube Industries, Ltd.) including a 12-μm-thick copper foil and a base made of a 25-μm-thick polyimide film was irradiated with UV laser from the side opposite to the copper foil to form vias 50 μm in diameter. The height of the protruding portion of a copper post was 8 μm from the base. A metal coating layer was formed to a thickness of 15 μm and the height of the protruding portion of the conductive post was 23 μm from the base. Then, a circuit was formed by etching and the substrate with conductive posts and a 13-μm-thick interlayer adhesive were bonded by thermocompression in a vacuum laminator at 120° C. and 0.1 MPa. Then a two-layer double-sided circuit board (PKW1012ECU from Arisawa Manufacturing Co., Ltd.) including a 12-μm thick copper foil and a base made of a 25-μm-thick polyimide film was etched to form a circuit. The ratio of the area of the conductor circuit here was 50%. Alignment and stacking using image processing was performed and the circuit board was pressed by vacuum pressing using a heat plate preheated to 260° C. at 2 MPa for 5 minutes.

Experimental Example C2

A multilayer circuit board was fabricated by the same method as that in experimental example C1, except that the thickness of the interlayer adhesive was 16 μm.

Experimental Example C3

A multilayer circuit board was fabricated by the same method as that in experimental example C1, except that the thickness of the interlayer adhesive was 25 μm.

Experimental Example C4

A multilayer circuit board was fabricated by using the same method as that in experimental example C1, except that the height of the protruding portion of the conductive post from the base was 35 μm.

Experimental Example C5

A multilayer circuit board was fabricated by using the same method as that in experimental example A1, except that a first circuit board without a conductive post protruding from the base was used.

Experimental Example C6

A 50-μm-thick polyethylene terephthalate was used as the protective film to fabricate a multilayer circuit board by following the process shown in FIG. 2. It was confirmed that a large amount of interlayer adhesive was left at the top portion of conductive posts.

Table 3 shows results of evaluation of the multilayer circuit boards fabricated by the processes in experimental examples C1 to C6. Experimental examples C1 to C4 show good results whereas the substrates in comparative examples C5 and C6 show performance defects.

TABLE 3

|  | Bonding ratio |
| --- | --- |
| Experimental example C1 | 100% |
| Experimental example C2 | 100% |
| Experimental example C3 | 90% |
| Experimental example C4 | 95% |
| Experimental example C5 | 10% |
| Experimental example C6 | 50% |

The invention claimed is:

1. A method for fabricating a multilayer circuit board, comprising:
    preparing a first film including a first protective film and a first interlayer adhesive stacked together;
    preparing a first circuit board including a first base and a conductive post protruding from said first base;
    stacking said first film and said first circuit board together so that said first interlayer adhesive and a top portion of said conductive post are brought into contact with each other;
    peeling off said first protective film from said first interlayer adhesive while selectively removing said first interlayer adhesive at said top portion of said conductive post with said first protective film to expose said top portion;

preparing a second circuit board including a conductive pad; and stacking and bonding said first circuit board and said second circuit board together through said first interlayer adhesive so that the exposed portion of said conductive post and said conductive pad are bonded together.

2. A method for fabricating a multilayer circuit board, comprising:

preparing a first film including a first protective film and a first interlayer adhesive stacked together;

preparing a first circuit board including a first base and a conductive post protruding from said first base;

stacking said first film and said first circuit board together so that said first interlayer adhesive and a top portion of said conductive post are brought into contact with each other;

peeling off said first protective film from said first interlayer adhesive while selectively removing said first interlayer adhesive at said top portion of said conductive post with said first protective film to expose said top portion;

preparing a second film including a second protective film and a second interlayer adhesive stacked together;

preparing a second circuit board including a second base and a conductive pad disposed over one surface of said second base, said conductive pad receiving said conductive post;

stacking said second film and said second circuit board together so that the surface of said interlayer adhesive and a conductive surface of said conductive pad are brought into contact with each other;

peeling off said second protective film from said second interlayer adhesive while selectively removing said second interlayer adhesive over said conductive surface of said conductive pad with said second protective film to expose said conductive surface; and stacking and bonding said first and second circuit boards together through said first and second interlayer adhesives so that said conductive post and said conductive pad face each other.

3. The method for fabricating a multilayer circuit board as set forth in claim 1, wherein the height of said first interlayer adhesive is lower than the height of the protruding portion of said conductive post from said first base.

4. The method for fabricating a multilayer circuit board as set forth in claim 2, wherein the thickness of said second interlayer adhesive is in the range between a half of the thickness of said conductive pad and the thickness of said conductive pad.

5. The method for fabricating a multilayer circuit board as set forth in claim 2, wherein said first and second interlayer adhesives are more adhesive to an insulator than to a conductor.

6. The method for fabricating a multilayer circuit board as set forth in claim 1, wherein said resin film is at least one resin film selected from the group consisting of a polyethylene terephthalate resin film, a polyethylene resin film, a polyimide resin film, a polyester resin film, a polypropylene resin film, and a polystyrene resin film.

7. The method for fabricating a multilayer circuit board as set forth in claim 1, wherein the thickness of said first protective film is equal to or more than 3 µm and equal to or less than 25 µm.

8. The method for fabricating a multilayer circuit board as set forth in claim 2, wherein the thickness of said second protective film is equal to or more than 25 µm and equal to or less than 50 µm.

9. The method for fabricating a multilayer circuit board as set forth in claim 1, wherein said conductive post includes a conductive post main body and a metal coating layer covering said conductive post main body.

10. The method for fabricating a multilayer circuit board as set forth in claim 9, wherein the thickness of said first interlayer adhesive is in the range between the height of the protruding portion of said conductive post main body from said first base and the height of protruding portion of said conductive post from said first base.

11. The method for fabricating a multilayer circuit board as set forth in claim 10, wherein the height of the protruding portion of said conductive post main body from said first base is equal to or more than 5 µm and equal to or less than 10 µm.

12. The method for fabricating a multilayer circuit board as set forth in claim 10, wherein the height of the protruding portion of said conductive post from said first base is equal to or more than 15 µm and equal to or less than 30 µm.

13. The method for fabricating a multilayer circuit board as set forth in claim 1, wherein the thickness of said conductive pad is equal to or more than 5 µm and equal to or less than 30 µm and the ratio of the area occupied by said conductive pad to the area of the surface of said second circuit board over which said conductive pad is formed is equal to or more than 30% and equal to or less than 70%.

14. A multilayer circuit board provided by a method set forth in claim 1.

15. A method for manufacturing a circuit plate provided by etching a multilayer circuit board provided by a method set forth in claim 1.

16. A circuit plate provided by the method set forth in claim 15.

17. The method for fabricating a multilayer circuit board as set forth in claim 2, wherein the height of said first interlayer adhesive is lower than the height of the protruding portion of said conductive post from said first base.

18. The method for fabricating a multilayer circuit board as set forth in claim 2, wherein each of said first and second protective films is a resin film.

19. The method for fabricating a multilayer circuit board as set forth in claim 18, wherein said resin film is at least one resin film selected from the group consisting of a polyethylene terephthalate resin film, a polyethylene resin film, a polyimide resin film, a polyester resin film, a polypropylene resin film, and a polystyrene resin film.

20. The method for fabricating a multilayer circuit board as set forth in claim 2, wherein the thickness of said first protective film is equal to or more than 3 µm and equal to or less than 25 µm.

21. The method for fabricating a multilayer circuit board as set forth in claim 2, wherein said conductive post includes a conductive post main body and a metal coating layer covering said conductive post main body.

22. The method for fabricating a multilayer circuit board as set forth in claim 21, wherein the thickness of said first interlayer adhesive is in a range between the height of the protruding portion of said conductive post main body from said first base and the height of protruding portion of said conductive post from said first base.

23. The method for fabricating a multilayer circuit board as set forth in claim 22, wherein the height of the protruding portion of said conductive post main body from said first base is equal to or more than 5 µm and equal to or less than 10 µm.

24. The method for fabricating a multilayer circuit board as set forth in claim 22, wherein the height of the protruding portion of said conductive post from said first base is equal to or more than 15 μm and equal to or less than 30 μm.

25. The method for fabricating a multilayer circuit board as set forth in claim 2, wherein the thickness of said conductive pad is equal to or more than 5 μm and equal to or less than 30 μm and the ratio of the area occupied by said conductive pad to the area of the surface of said second circuit board over which said conductive pad is formed is equal to or more than 30% and equal to or less than 70%.

26. A multilayer circuit board provided by a method set forth in claim 2.

27. A method for manufacturing a circuit plate provided by etching a multilayer circuit board provided by a method set forth in claim 2.

28. A circuit plate provided by the method set forth in claim 27.

* * * * *